United States Patent [19]

Hara et al.

[11] Patent Number: 4,933,243

[45] Date of Patent: Jun. 12, 1990

[54] RECORDING MEDIUM

[75] Inventors: Hajime Hara, Fujisawa; Shingo Orii, Kawasaki; Tetsuo Satoh, Yokohama; Tomohiro Toya, Yokohama; Shigeki Iida, Yokohama, all of Japan

[73] Assignee: Nippon Oil Company, Limited, Japan

[21] Appl. No.: 233,852

[22] Filed: Aug. 15, 1988

Related U.S. Application Data

[63] Continuation of Ser. No. 909,484, Sep. 19, 1986, abandoned.

[30] Foreign Application Priority Data

Sep. 20, 1985 [JP] Japan ................................. 60-206563

[51] Int. Cl.$^5$ ........................ G03C 11/00; G02F 1/03; C09K 19/00
[52] U.S. Cl. ........................................ 430/20; 430/19; 428/1; 350/350 R; 350/346
[58] Field of Search ....................... 430/19, 20; 428/1; 350/350 R, 346

[56] References Cited

U.S. PATENT DOCUMENTS

| | | | |
|---|---|---|---|
| 3,654,864 | 4/1972 | Ovshinsky | 430/19 |
| 3,655,971 | 4/1972 | Haas et al. | 430/20 X |
| 4,394,498 | 9/1983 | Kastelic | 428/1 |
| 4,412,059 | 10/1983 | Krigbaum et al. | 428/215 X |
| 4,652,626 | 3/1987 | Orii et al. | 528/176 X |

FOREIGN PATENT DOCUMENTS 0072210  2/1983  European Pat. Off. ................ 428/1

*Primary Examiner*—Roland E. Martin
*Assistant Examiner*—Cynthia Hamilton
*Attorney, Agent, or Firm*—Scully, Scott, Murphy & Presser

[57] ABSTRACT

A rewritable or repeatedly employable recording medium having a base and a recording layer film provided on said base, characterized in that said recording layer film is formed by a thermotropic cholesteric liquid crystal polyester.

6 Claims, No Drawings

RECORDING MEDIUM

This application is a continuation of application Ser. No. 909,484, filed Sept. 19, 1986, now abandoned.

BACKGROUND OF THE INVENTION

The present invention relates to a novel recording medium suitable for a thermal recording of image, characters, etc.

Recently, with a rapid progress of opto-electronic system, there has been popularly used a method in which information optically-read or stored in a memory are converted to such an output as heat or laser beam and recorded on a recording medium. For example, a signal is converted to a laser beam, then the laser beam is applied to a recording medium having an amorphous metal or a photosensitive agent and is recorded thereon by a physical change or discoloration of the recording medium.

In such conventional method, however, it is necessary to go through an expensive and complicated process such as vapor metalizing and the use of an expensive photosensitive agent is essential, thus resulting in a greatly increased production cost.

SUMMARY OF THE INVENTION

It is the object of the present invention to provide a novel recording medium free of the abovementioned drawbacks and particularly provide a novel recording medium which permits the use of a relatively inexpensive material and can be produced in a simple manner. The recording is made by a contrast between the portion of a recording layer which has been rendered transparent by heat and an opaque portion, further, the storage of recorded information is semipermanent and it is possible to effect rewriting.

The present invention relates to a recording medium having a recording layer formed by a thermotropic cholesteric liquid crystal polyester. More particularly, it is concerned with a rewritable or repeatedly employable recording medium having a base and a recording layer film formed thereon, in which the recording layer film is formed by a thermotropic cholesteric liquid crystal polyester, and at room temperature or thereabouts the said polyester is in a polydomain state or crystallized state and is opaque, and by melting in a liquid crystal forming temperature region said polydomain state or crystallized state is transformed into a monodomain state, and by cooling rapidly and maintaining the monodomain state at room temperature, the recording layer film can be made transparent.

DETAILED DESCRIPTION OF THE INVENTION

As the base in the recording medium of the present invention there may be used, for example a polycarbonate, polyether imide or polyimide film or sheet, or a glass plate, or the said film or sheet plus a reflective layer formed thereon by vapor metalizing or plating, or a film or sheet of a metal having a mirror surface.

The recording layer film on the base is a film of a thermotropic cholesteric liquid crystal polyester, which is formed on the base in a thickness of 1 to 100 μm by a conventional method. The recording medium may be further covered with a transparent film as a protective film.

The cholesteric liquid crystal polyester used in the present invention is prepared by copolymerizing a nematic or smectic liquid crystal polyester with an optically active component. Such nematic or smectic liquid crystal polyester is an aromatic polyester usually having, as mesogens, structural units selected from the following structural units derived from aromatic diols and those derived from aromatic dicarboxylic acids or cyclohexanedicarboxylic acids.

As structural units derived from aromatic diols:

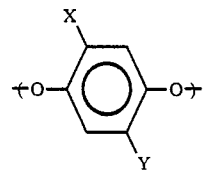

wherein X and Y are each independently hydrogen, halogen, or an alkyl group having not more than four carbon atoms,

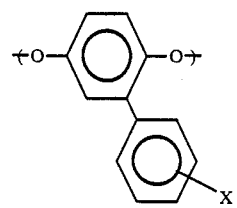

wherein X is hydrogen, halogen, or an alkyl group having not more than four carbon atoms,

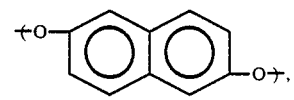

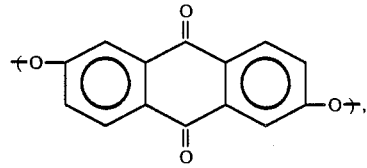

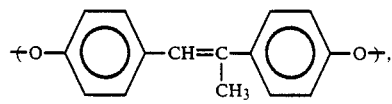

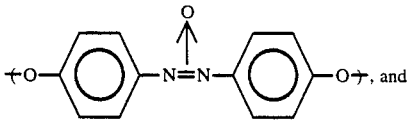

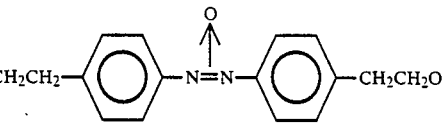

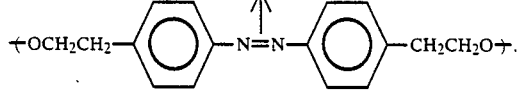

As structural units derived from aromatic dicarboxylic acids or cyclohexanedicarboxylic acids:

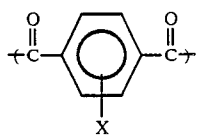

wherein X is hydrogen, halogen, or an alkyl group having not more than four carbon atoms,

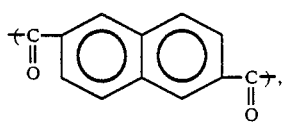

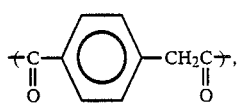

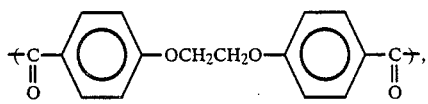

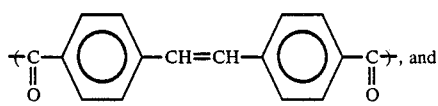

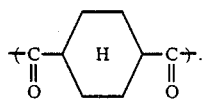

Or it is a polyester usually having, as mesogens, structural units selected from the following structural units derived from aromatic hydroxycarboxylic acids:

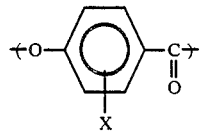

wherein X is hydrogen, halogen, or an alkyl group having not more than four carbon atoms,

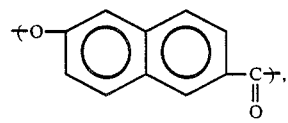

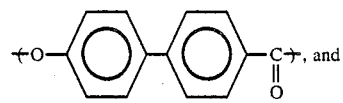

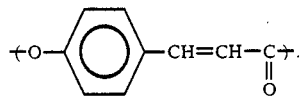

The cholesteric liquid crystal polyester is prepared by copolymerizing the aromatic polyester having such structural units as mesogens with an optically active components. As the optically active component there is used an optically active compound which is copolymerizable with such structural units. Selecting a bifunctional compound as the optically active component is desirable in that it can be introduced in any desired amount into the polymer chain. Even a monofunctional compound which can be introduced only in polymer ends is also employable in the present invention if it exhibits a cholesteric liquid crystal mesophase.

As examples of bifunctional optically active monomers there are mentioned dicarboxylic acids such as (R)- or (S)-3-methyladipic acid and benzoylglutamic acid; (R)- or (S)-diols such as 1,2-propanediol and 2-methyl-1,4-butanediol; and (R)- or (S)-hydroxy acids such as 3-hydroxybutanoic acid and 2-methyl-3-hydroxypropionic acid. These may be used each alone or as a mixture in the copolymerization. Optical purity need not always be 100%, but in the case of a mixture a helical pitch in cholesteric liquid crystal becomes large as compared with that from a pure (R) or (S) form and the cholesteric mesophase forming ability is deteriorated. Generally, the difference between the content of (R) form and that of (S) form should be not less than 15%, preferably not less than 30%.

The optically active component is present at a proportion of 1 to 10 mol%.

The cholesteric liquid crystal polyester used in the present invention may incorporate a further unit exemplified below for the adjustment of its melting point:

Monomer units such as m-substituted benzene derivatives and 2,7-substituted naphthalene derivatives, e.g.:

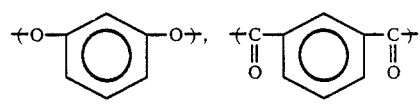

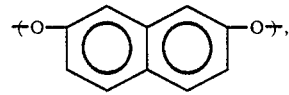

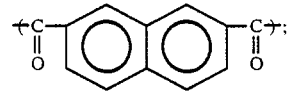

Monomer units containing a freely rotatable group between aromatic rings such as those represented by the following general formulae:

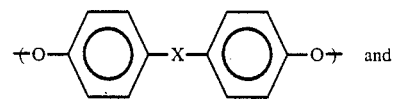

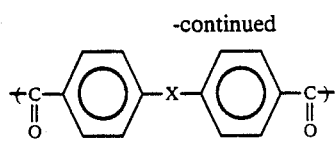

wherein X is O, $CH_2$, $C(CH_3)_2$, or $SO_2$.

Units derived from aliphatic diols and aliphatic dicarboxylic acids represented by the following general formulae:

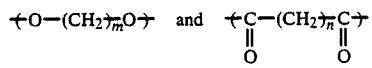

wherein m and n are each an integer of 2 to 12.

The cholesteric liquid crystal polyester used in the present invention can be prepared by a conventional method. For example, a diacid chloride condenses with a diol while allowing dehydrochlorination to take place; or a dicarboxylic acid dimethyl ester or diphenyl ester condenses with a diol at a high temperature under a high vacuum; or a dicarboxylic acid condenses with a diacetylated diol at a high temperature under a high vacuum; or a dicarboxylic acid condenses directly with a diol in the presence of a condensing agent such as a phosphorus compound. In the case of using a hydroxycarboxylic acid compound with the monomers mentioned above, a copolycondensation can be performed according to the above polymerization method.

The cholesteric liquid crystal polyester used in the present invention is formed into a film of 1 to 100 μm, preferably 2 to 50 μm, in thickness and heat-melted in a liquid crystal forming temperature region ranging from 150° to 350° C., preferably 200° to 300° C., whereby it can be changed from a polydomain state to a monodomain state or a state akin to monodomain. By a rapid cooling from the liquid crystal forming temperature region down to a temperature below the crystallization temperature [or below Tg temperature (glass transition temperature) if crystallization does not take place] a monodomain state can be frozen.

The term "polydomain" represents a state as followed; constituent domains of a cholesteric liquid crystal are so small in size and the direction of helical axes are so randomly oriented in a film, that light is scattered at crystal interfaces to afford an opaque film. On the other hand, the term "monodomain or ordered planar texture represents a state in which the helical axis of cholesteric liquid crystal is perpendicular to the film plane and the cholesteric laminate structure spreads throughout the whole surface of film like an ideal single crystal as a result of uniting polydomains in a heat-melted condition. In this case, if the helical axis pitch length is close to the wavelength of visible light, a light corresponding to the wavelength $\lambda_o$ is reflected selectively in accordance with the following equation:

$$\lambda_o = nP$$

wherein n and P represent an average refractive index and a helical axis pitch length, respectively, and the film looks colored. If $\lambda_o$ deviates from the visible light wavelength, the film looks colorless and transparent.

Conversely, the change from transparent to opaque state is attained by cooling molten cholesteric liquid crystal slowly to let crystallization take place. It is also possible to obtain a polydomain opaque state by applying an electric or magnetic field to liquid crystal in a molten state to disorder the orientation of liquid crystal followed by cooling rapidly in the disordered state. Thus, by using the cholesteric liquid crystal polyester of the present invention it is made possible to effect the change from transparent to opaque state, and vice versa, reversibly; that is, the said polyester is suitable for use as a writable and erasable recording medium.

The melting of the cholesteric liquid crystal polyester is attained by applying a heat source such as laser beam, xenon lamp light or a high frequency to a required portion.

Recorded information are taken out by the difference in transmission of light or by the difference in reflectivity of light or any other suitable means.

On the basis of such principle the recording medium of the present invention can be utilized as an optical disc memory or a photo mask for a printing plate or electronic circuits.

EXAMPLES

The following examples are given to illustrate the invention in more detail.

EXAMPLE 1

15.55 g of polyethylene terephthalate having an inherent viscosity (η inh) of 0.37 dl/g as measured using a mixed solvent of phenol/tetrachloroethane (60/40 by weight) at 30° C. at a concentration of 0.5 wt.% (the following η inh values were also measured according to this method), 34.02 g of p-acetoxybenzoic acid--, 4.33 g of (R)-3-methyladipic acid and 5.24 g of diacetylated hydroquinone were charged into a polymerization flask equipped with a stirrer, then after purging with nitrogen, the polymerization flask was dipped in an oil bath held at 220° C. and reaction was allowed to take place for 1 hour in a nitrogen atmosphere under stirring, then the temperature was raised to 230° C. and reaction was allowed to proceed for another one hour. At 230° C. nitrogen was started to flow and after one hour, the reaction was allowed to proceed for further one hour under a reduced pressure. Then the reaction temperature was raised from 230° C. to 270° C. over a period of about 30 minutes, and at 270° C. the degree of vacuum was held at 0.2 mmHg for 1 hour to complete the polymerization. As a result, there was obtained a polymer having η inh=0.45 dl/g.

The polymer was dissolved in p-chlorophenol to prepare a 10 wt.% solution. This solution was applied onto an 80 um polyimide film by means of a roll coater and dried for 12 hours at room temperature and for 3 hours at 100° C. under vacuum to obtain a recording medium having a thickness of 6.5 μm. The transmission of the recording medium was measured using a monochromatic light having a wavelength of 800 nm through a spectrophotometer. When the recording medium was heated to 250° C. and then cooled rapidly, its transmission was found to be 90.5%. The recording medium was again heated to 250° C. and then cooled slowly at a rate of 20° C./min; as a result, its transmission was 24.5%. When it was again heated to 250° C. followed by cooling rapidly, there was observed a recovery of transmission to 90.1%. The degree of transparency and that of opaqueness did not change at all even after the lapse of three months at room temperature.

EXAMPLE 2

Polymerization was performed under the same conditions as in Example 1 except that the amounts of polyethylene terephthalate, p-acetoxybenzoic acid, (R)-3-methyladipic acid and diacetylated hydroquinone were changed to 7.68 g, 32.40 g, 3.20 g and 3.84 g, respectively, to afford a polymer having η inh of 0.48 dl/g. The polymer was applied onto a polyimide film in the same way as in Example 1 to obtain a recording medium having a thickness of 6.5 μm. When this recording medium was heated to 290° C. and then cooled rapidly, its transmission was found to be 90.1%. The recording medium was again heated to 290° C. and then cooled slowly at a rate of 20° C./min; as a result, its transmission was 21.3%. When it was again heated to 290° C. followed by cooling rapidly, there was observed a recovery of transmission to 92.3%. The degree of transparency and that of opaqueness did not change at all even after the lapse of three months at room temperature.

EFFECT OF THE INVENTION

The recording medium of the present invention can create both transparent and opaque portions under the supply of heat; besides, the change from one to another is reversible and a semipermanent storage of recorded information can be effected at room temperature or thereabouts. Further, since recorded information can be taken out using light, the recording medium of the present invention is suitable for use as an optical disc memory or a photo mask.

What is claimed is:

1. A rewritable or repeatably employable recording medium comprising a base and a recording layer film deposited on said base; said recording layer film being a film of a thermotropic cholesteric liquid crystal polyester; said recording layer film being reversibly transparent or opaque, said film being transparent at room temperature by heat-melting said film at the liquid crystal forming temperature followed by rapid cooling from said liquid crystal forming temperature to room temperature and being opaque at room temperature by heat-melting said film at the liquid crystal forming temperature followed by either (a) slow cooling to room temperature or (b) the application of an electrical or a magnetic field followed by rapid cooling to room temperature; said cholesteric liquid crystal polyester of said recording layer film formed by copolymerizing an optically active compound with a mesogen, said mesogen have a structural unit selected from the group consisting of

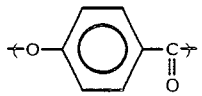

the combination of

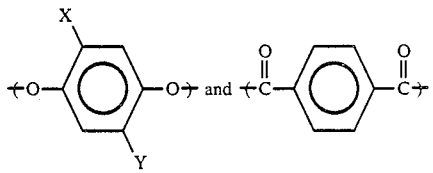

and the combination of

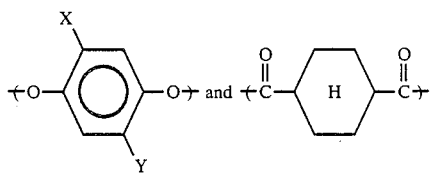

where X and Y are each independently hydrogen, halogen or an alkyl group having no more than four carbon atoms.

2. The recording medium of claim 1, wherein said thermotropic cholesteric liquid crystal polyester has a liquid crystal forming temperature in the range of 150° to 350° C.

3. The recording medium of claim 1 wherein said recording layer film has a thickness in the range of 1 to 100 μm.

4. The recording medium of claim 1, wherein (R)- or (S)-3- methyladipic acid is copolymerized with the mesogen.

5. The recording medium of claim 1, wherein (R)- or (S)-2-methyl-1,4-butanediol is copolymerized with the mesogen.

6. The recording medium of claim 4, wherein said optically active component is present in a proportion of 1 to 10 mol% of all monomer units.

* * * * *